(12) United States Patent
Luo et al.

(10) Patent No.: US 9,157,014 B2
(45) Date of Patent: Oct. 13, 2015

(54) ADHESIVES INCLUDING A FILLER MATERIAL AND RELATED METHODS

(71) Applicant: Micron Technology, Inc., Boise, ID (US)

(72) Inventors: Shijian Luo, Boise, ID (US); Xiao Li, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 146 days.

(21) Appl. No.: 13/689,144

(22) Filed: Nov. 29, 2012

(65) Prior Publication Data

US 2014/0147989 A1    May 29, 2014

(51) Int. Cl.
| | |
|---|---|
| *C09J 11/04* | (2006.01) |
| *H01L 21/683* | (2006.01) |
| *C08K 3/00* | (2006.01) |
| *C08K 3/04* | (2006.01) |
| *C08K 3/14* | (2006.01) |
| *C08K 3/22* | (2006.01) |
| *C08K 3/36* | (2006.01) |
| *C08K 7/18* | (2006.01) |

(52) U.S. Cl.
CPC .............. *C09J 11/04* (2013.01); *H01L 21/6835* (2013.01); *C08K 3/0033* (2013.01); *C08K 3/04* (2013.01); *C08K 3/14* (2013.01); *C08K 3/22* (2013.01); *C08K 3/36* (2013.01); *C08K 7/18* (2013.01); *C09J 2203/326* (2013.01); *H01L 2221/6834* (2013.01); *H01L 2221/68327* (2013.01); *H01L 2221/68381* (2013.01)

(58) Field of Classification Search
CPC ....................................................... C09J 11/04
USPC ......... 524/406, 413, 430, 432, 440, 441, 493, 524/496, 497
See application file for complete search history.

(56) References Cited

U.S. PATENT DOCUMENTS

| 4,097,445 | A | 6/1978 | Martins et al. |
|---|---|---|---|
| 7,541,264 | B2 | 6/2009 | Gardner et al. |
| 7,629,695 | B2 | 12/2009 | Yoshimura et al. |
| 2003/0069331 | A1 | 4/2003 | Teiichi et al. |
| 2010/0159644 | A1 | 6/2010 | Dunne et al. |
| 2010/0305236 | A1* | 12/2010 | Scholz et al. ................. 523/402 |
| 2011/0297300 | A1 | 12/2011 | Furuya |
| 2012/0068342 | A1 | 3/2012 | Lee |
| 2012/0164827 | A1 | 6/2012 | Rajagopalan et al. |
| 2012/0168933 | A1 | 7/2012 | Lu et al. |
| 2012/0175045 | A1 | 7/2012 | Furuya et al. |

FOREIGN PATENT DOCUMENTS

JP      2012025879 A      2/2012

OTHER PUBLICATIONS

Jiang et al, 3D Integration—Present and Future, 2008 10th Electronics Packaging Technology Conference (2008) pp. 373-378.
Shuangwu et al., Temporary Bonding of Wafer to Carrier for 3D-Wafer Level Packaging, 2008 10th Electronics Packaging Technology Conference (2008) pp. 405-411.
Zussman et al., Using Permanent and Temporary Polyimide Adhesives in 3D-TSV Processing to Avoid Thin Wafer Handling, Journal of Microelectronics and Electronic Packaging, vol. 7 (2010) pp. 214-219.

* cited by examiner

*Primary Examiner* — Edward Cain
(74) *Attorney, Agent, or Firm* — TraskBritt

(57) ABSTRACT

Temporary adhesives include a thermoplastic polymer comprising from about 30% by weight to about 80% by weight of the temporary adhesive, a solvent comprising from about 20% by weight to about 70% by weight of the temporary adhesive, and a filler material comprising from about 0.2% to about 5% by weight of the temporary adhesive. Methods of processing a semiconductor device wafer include bonding the semiconductor device wafer to a surface of a carrier substrate using a temporary adhesive including a filler material comprising from about 0.2% to about 5% by weight of the temporary adhesive, thinning the semiconductor device wafer, and, while the temporary adhesive remains on the surface of the carrier substrate proximate a peripheral edge thereof, subjecting the thinned semiconductor device wafer to one or more back side processing operations. Methods of forming a thinned semiconductor wafer include using such a temporary adhesive.

27 Claims, 4 Drawing Sheets

ADHESIVES INCLUDING A FILLER MATERIAL AND RELATED METHODS

FIELD

Embodiments of the present disclosure relate to compositions of a temporary adhesive and related methods, such as for removably bonding semiconductor device wafers to carrier substrates during processing of the semiconductor device wafers.

BACKGROUND

There is a trend in the electronics industry to reduce the size of components of electronic devices. Such a reduction in size may enable reduced cost, increased efficiency, lower energy requirements, among other benefits. Semiconductor device packages (e.g., memory, processors, light-emitting diodes (LEDs), micro-electromechanical system (MEMS) device packages, etc.) have been the subject of a variety of size reduction efforts. For example, one method of reducing the thickness of semiconductor devices and packages includes using so-called "through-silicon vias" (TSVs). In so-called "three-dimensional (3D) integration," for example, electrical access to stacked semiconductor dice is provided through the TSVs. Semiconductor wafers including TSVs are often thinned to form semiconductor dice that may be stacked to form semiconductor device packages of a relatively low height. Such thinning renders the semiconductor wafer fragile and difficult to handle during subsequent processing. Accordingly, the semiconductor wafer may be temporarily bonded to a carrier substrate to provide mechanical stability and strength during thinning and subsequent processing.

FIGS. 1A through 1C illustrate a conventional method of processing a semiconductor device wafer 10. With reference to FIG. 1A, a device region 12 is defined by a portion of the semiconductor device wafer 10 proximate a front surface 14 thereof, which may also be characterized as an "active surface" on which integrated circuitry is formed. The device region 12 includes features of a semiconductor device to be formed from the semiconductor device wafer 10, such as through-silicon vias (TSVs) 18, extending from the front surface 14 into and at least partially through the device region 12. The semiconductor device wafer 10 is bonded to a relatively rigid carrier substrate 20 with a temporary adhesive 30 including a thermoplastic polymer material and a solvent, which is subjected to heat to remove at least a portion of the solvent. A top surface 22 of the carrier substrate 20 includes an edge region 28 proximate a peripheral edge 26 of the carrier substrate 20 that does not directly underlie the device region 12.

After bonding the semiconductor device wafer 10 to the carrier substrate 20, the semiconductor device wafer 10 may be subjected to further processing, which is often referred to in the art as "back side processing." For example, material may be removed from a back surface 16 of the semiconductor device wafer 10 by mechanical grinding and/or polishing, (e.g., coarse mechanical grinding, fine mechanical grinding, chemical-mechanical polishing (CMP), or any combination thereof) to leave a thinned semiconductor device wafer 11 (referred to below as "thinned wafer 11" for simplicity), as shown in FIG. 1B. After thinning, other processes may be performed on the back surface 16 of the thinned wafer 11, such as material removal, cleaning, and material formation.

Referring to FIG. 1C, processes that involve application of heat to the thinned wafer 11 and, consequently, to the temporary adhesive 30, may cause the temporary adhesive 30 to soften and flow to contaminate one or both of the back surface 16 of the thinned wafer 11 and a bottom surface 24 of the carrier substrate 20. Such contamination may cause difficulties and errors in subsequent processing of the thinned wafer 11. In some cases, the entire thinned wafer 11 or portions thereof may be rendered useless due to the contamination of the back surface 16 and/or the bottom surface 24 with the temporary adhesive 30. After back side processing is complete, the thinned wafer 11 of FIG. 1B or 1C is debonded from the carrier substrate 20 by applying a shear stress and heat to the temporary adhesive 30.

FIGS. 2A through 2C illustrate another method of processing a thinned semiconductor device wafer 11. After the thinned wafer 11 is formed and a bond is established between the thinned wafer 11 and the carrier substrate 20 with the temporary adhesive 30, as described above with reference to FIGS. 1A and 1B, the temporary adhesive 30 is removed from the edge region 28 of the carrier substrate 20, as shown in FIG. 2A, by a so-called "edge cleaning" process. The exposed temporary adhesive 30 is removed by applying a suitable solvent. The solvent may be applied in a manner such that a portion of the temporary adhesive 30 underlying a peripheral edge 40 of the thinned wafer 11 is removed, in addition to the portion over the edge region 28.

Referring to FIG. 2B, the temporary adhesive 30 may be subjected to an elevated temperature (e.g., between about 150° C. and about 300° C., such as between about 180° C. and about 220° C.) to soften and flow the temporary adhesive 30 to support the peripheral edge 40 and to remove solvent introduced and absorbed by the temporary adhesive 30 during the edge cleaning. As a result of the heating, a portion of the temporary adhesive 30 may flow onto the edge region 28. As the temporary adhesive 30 softens under the elevated temperature, an average bond line thickness $T_{BL}$ of the temporary adhesive 30 may be reduced, at least proximate the peripheral edge 40, due to the flowing of the temporary adhesive 30 onto the edge region 28. As shown in FIG. 2C, subsequent processing operations that involve application of heat may cause the temporary adhesive 30 to continue to flow further onto the edge region 28 of the carrier substrate 20.

The method described with reference to FIGS. 2A through 2C may reduce a risk of contamination of the back surface 16 of the thinned wafer 11 and of the bottom surface 24 of the carrier substrate 20 compared to the method described with reference to FIGS. 1A through 1C. However, there may still be some risk that contamination of one or both of the back surface 16 of the thinned wafer 11 and the bottom surface 24 of the carrier substrate 20 due to flowing temporary adhesive 30 may occur during processing operations that involve heat. In addition, non-uniformity caused by reduction of the average bond line thickness $T_{BL}$ proximate the peripheral edge 40 may reduce control and reliability of back side processes performed on the thinned wafer 11.

Additional issues may be introduced by performing the operations described in FIGS. 2A and 2B. For example, the cleaning and subjecting to an elevated temperature may add to the time and cost of processing the thinned wafer 11. Additionally, the temporary adhesive 30 may not flow all the way to the peripheral edge 40 of the thinned wafer 11 while being subjected to an elevated temperature after cleaning the edge region 28, which may result in chipping, lifting, or delamination of the peripheral edge 40 during subsequent processing.

In addition, if the solvent is not substantially completely removed from the temporary adhesive 30 after the cleaning of the edge region 28, then one or more voids in the temporary adhesive 30 may develop during subsequent processing, causing the bond between the thinned wafer 11 and the carrier substrate 20 to weaken or even to fail (e.g., delaminate) where the void forms.

Whether the method described above with reference to FIGS. 1A through 1C or the method described above with reference to FIGS. 2A through 2C is used, the front surface 14 of the thinned wafers 11 may include irregular, which may also be characterized as nonplanar, topography (i.e., features, such as discrete conductive elements such as pads, bumps, columns, or pillars, that extend to a significant height above the front surface 14 of the thinned wafer 11). Such nonplanar topography may aggravate the problems discussed, as the topography requires additional temporary adhesive 30 to fill a gap between the thinned wafer 11 and the carrier substrate 20. The additional temporary adhesive 30 may increase a risk that the temporary adhesive 30 will flow during back side processing, potentially causing one or more of the problems discussed above.

BRIEF DESCRIPTION OF THE DRAWINGS

FIG. 1A is a partial cross-sectional view of a semiconductor device wafer bonded to a carrier substrate using a temporary adhesive.

FIG. 1B is a partial cross-sectional view of the structure of FIG. 1A after the semiconductor device wafer has been thinned.

FIG. 1C is a partial cross-sectional view of the structure of FIG. 1B after processing has caused at least some of the temporary adhesive to flow onto a back surface of the thinned semiconductor device wafer and onto a bottom surface of the carrier substrate.

FIG. 2A is a partial cross-sectional view of the structure of a structure similar to the structure of FIG. 1B after a portion of the temporary adhesive has been removed from a portion of a top surface of the carrier substrate proximate a peripheral edge thereof, such as by using a solvent.

FIG. 2B is a partial cross-sectional view of the structure of FIG. 2A after the structure has been subjected to heat to remove solvent from the temporary adhesive.

FIG. 2C is a partial cross-sectional view of the structure of FIG. 2B after the structure has been processed at a heat sufficient to flow at least a portion of the temporary adhesive.

FIG. 4 is a partial cross-sectional view of the semiconductor device wafer bonded to a carrier substrate using a temporary adhesive including a nano-filler material, according to an embodiment of the present disclosure.

FIG. 5 is a partial cross-sectional view of the structure of FIG. 4 after the semiconductor device wafer has been thinned, according to an embodiment of the present disclosure.

FIG. 6 is a partial cross-sectional view of the structure of FIG. 5 after a portion of the temporary adhesive including the nano-filler material has been removed from a portion of a top surface of the carrier substrate proximate a peripheral edge thereof, according to an embodiment of the present disclosure.

DETAILED DESCRIPTION

Figure 1A:
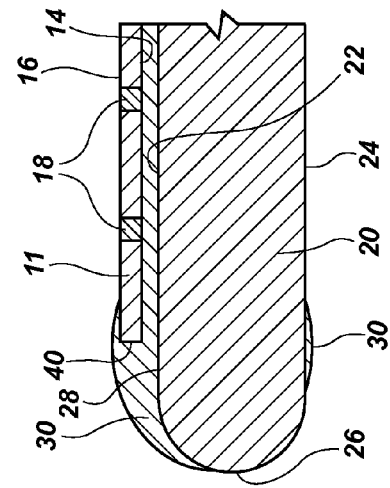
FIGS. 1A through 1C illustrate a conventional method of processing a semiconductor device wafer.

As used herein, the term "substantially" in reference to a given parameter means and includes to a degree that one of ordinary skill in the art would understand that the given parameter, property, or condition is met with a small degree of variance, such as within acceptable manufacturing tolerances.

As used herein, any relational term, such as "first," "second," "over," "on," "top," "bottom," "underlying," "front," "back," etc., is used for clarity and convenience in understanding the disclosure and accompanying drawings and does not connote or depend on any specific preference, orientation, or order, except where the context clearly indicates otherwise.

As used herein, the phrase "semiconductor device wafer" means and includes any wafer or substrate of any shape and size that includes intermediate or finished materials or structures used in forming a semiconductor device, such as a memory device, an imaging device, a light-emitting diode (LED) device, a processor device, a logic device, a microelectromechanical system (MEMS) device, etc.

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below may not form a complete process flow for manufacturing semiconductor devices. The structures described below do not form complete semiconductor devices. Only those process acts and structures necessary to understand embodiments of the present disclosure are described in detail below. Additional acts to form complete semiconductor devices and systems may be performed by conventional fabrication techniques. Accordingly, only the methods and memory device structures necessary to understand embodiments of the present disclosure are described herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and compositional changes may be made without departing from the scope of the disclosure. The illustrations presented herein are not meant to be actual views of any particular system, device, structure, or memory cell, but are merely idealized representations that are employed to describe the embodiments of the present disclosure. The drawings presented herein are not necessarily drawn to scale. Additionally, elements common between drawings may retain the same numerical designation. However, any similarity in numbering does not mean that the structures or components are necessarily identical in size, composition, configuration, or other property.

The embodiments of the present disclosure include compositions for temporary adhesives and methods that may be useful for temporarily bonding substrates or structures together, such as for bonding a semiconductor device wafer to a carrier substrate during processing of the semiconductor device wafer. The temporary adhesives of the present disclosure may include a filler material that may alter one or more physical properties of the temporary adhesives and that may improve efficiency in manufacturing a semiconductor device from the semiconductor device wafer. For example, the filler material may improve mechanical stability of the temporary adhesive during processing of the semiconductor device wafer, while still enabling debonding through conventional shearing techniques, as described in more detail below. Although the compositions and methods are shown and described herein with reference to processing a semiconductor device wafer, other applications may become apparent to one of ordinary skill in the art upon consideration of the present disclosure.

Figure 1B:
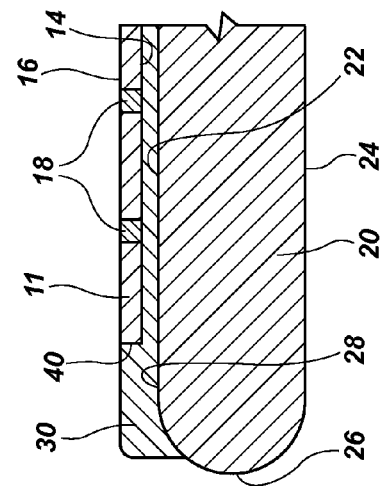
Figure 1C:
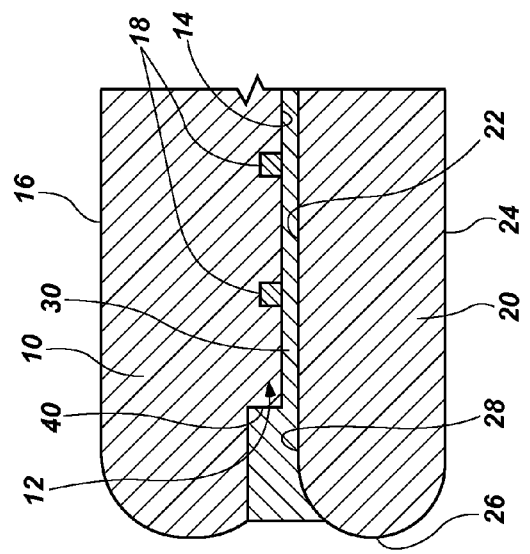
Figure 2A:
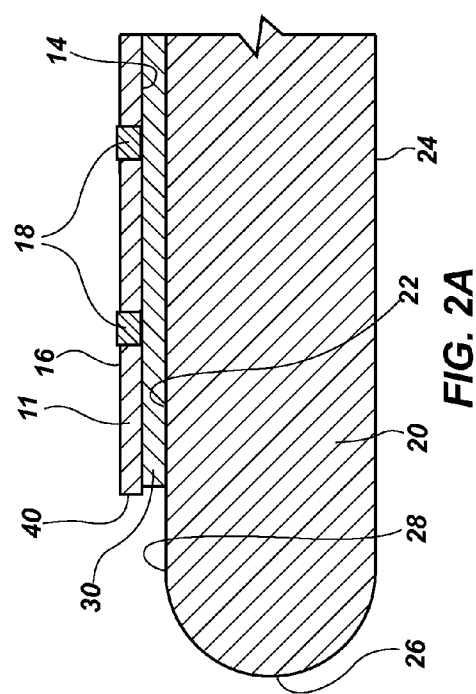
FIGS. 2A through 2C illustrate another conventional method of processing a semiconductor device wafer.
Figure 2C:
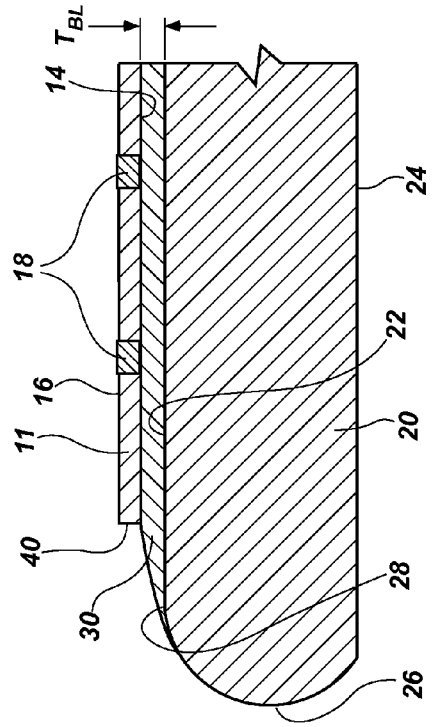
Figure 2B:
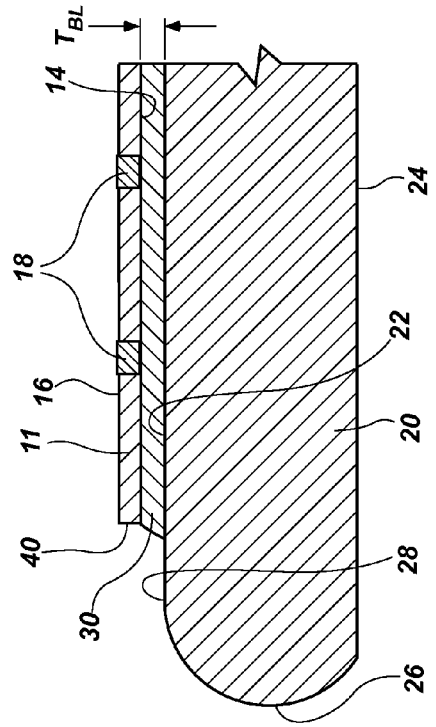

The present disclosure includes temporary adhesive compositions and related methods that may alleviate one or more of the problems associated with the method described above with reference to FIGS. 1A through 1C, while reducing or avoiding one or more of the additional problems and inefficiencies associated with the method described above with reference to FIGS. 2A through 2C.

In some embodiments of the present disclosure, from about 30% by weight to about 80% by weight of a temporary adhesive may be a thermoplastic polymer, from about 20% by weight to about 70% by weight may be a solvent, from about 0.2% by weight to about 5% by weight may be a filler material, and, optionally, less than about 1% by weight may be one or more other additives. The listed weight percentages correspond to an initial composition of the temporary adhesive prior to heating or other processes that may alter the composition (e.g., through removal of solvent, through curing the temporary adhesive). The filler material in the temporary adhesive may enable the temporary adhesive to exhibit mechanical stability (e.g., a relatively higher viscosity) at the conditions (e.g., temperature, shear rate, etc.) to which the temporary adhesive is subjected during back side processing, while still enabling the thinned wafer to be debonded from the carrier substrate when back side processing is complete, as explained in more detail below with reference to the graph of FIG. 3. The mechanical stability may reduce or avoid a risk of undesired contamination of portions of the thinned wafer and carrier substrate, as described above with reference to FIGS. 1A through 1C. The higher viscosity of the temporary adhesive may also improve the mechanical stability by increasing the rigidity of the temporary adhesive and the bond provided by the adhesive, which reduces edge lifting and void formation. Additionally, the extra acts described above with reference to FIGS. 2A through 2C may be avoided or reduced in number, as explained in more detail below with reference to FIGS. 4 through 6.

The thermoplastic polymer may be a material that is chemically and mechanically stable at temperatures of up to about 200° C., up to about 260° C., or even up to about 350° C., at shear rates experienced during back side processing. Thus, the thermoplastic polymer may be resistant to chemical outgassing, degradation, and decomposition and may be resistant to flowing, deformation, or other mechanical defects under the temperature and shear rate conditions experienced during back side processing. Additionally, the thermoplastic polymer used in the temporary adhesive may be soluble in a solvent that can be removed from the composition, such as by heating the temporary adhesive at a temperature of less than about 350° C. (e.g., between about 150° C. and about 200° C.). Such thermoplastic polymers are known in the art. By way of non-limiting example, the thermoplastic polymer may include one or more of an aliphatic resin, an aromatic resin, and a block copolymer. By way of further non-limiting example, the thermoplastic polymer may include one or more of a polyolefin resin, a thermoplastic polyurethane, a thermoplastic copolyester, a thermoplastic organopolysiloxane, a thermoplastic polyimide, a thermoplastic polyamide, and a styrenic block copolymer.

Certain back side processing operations, such as mechanical grinding and chemical-mechanical polishing (CMP), may induce some shear stress in the temporary adhesive. Other back side processing operations, such as chemical vapor deposition (CVD) and physical vapor deposition (PVD), may expose the temporary adhesive to an elevated temperature. However, the temporary adhesive is generally not subjected to both shear stress and elevated temperature at the same time. Thus, debonding may be inhibited until back side processing is complete and the thinned wafer is purposefully debonded from the carrier substrate by subjecting the temporary adhesive to both shear stress and heat.

The solvent of the temporary adhesive may be selected based on the thermoplastic polymer used. Any solvent that can at least partially dissolve the selected thermoplastic polymer may be used. By way of example and not limitation, the solvent may include one or more of n-decane, isododecane, isododecene, d-limonene, and mesitylene. The solvent may be substantially removed from the temporary adhesive, such as by exposing the temporary adhesive to a temperature of less than about 350° C., such as between about 150° C. and about 200° C. To substantially remove the solvent, the elevated temperature may be maintained for a period of time sufficient to remove substantially all of the solvent, such as between about 1 minute and about 120 minutes, for example. As used herein, in relation to removal of solvent from the temporary adhesive, the phrase "substantially remove" means and includes removing at least about 95% of the volume of the solvent that is initially present in the temporary adhesive. In some embodiments, about 100% of the solvent may be removed.

The filler material may include nanoparticles, each having an average particle diameter of between about 3 nm and about 100 nm, such as, for example, between about 5 nm and about 60 nm, between about 10 nm and about 30 nm, or between about 10 nm and about 15 nm. The particles in the filler material may have any shape depending on the material of the filler material and on the formation technique used to form the filler material. For example, the particles may have a relatively smooth and spherical shape, another regular shape (e.g., crystalline), an irregular shape, or a combination of such shapes. The filler material may be insoluble in the selected solvent, and may include one or more of a ceramic material, an oxide material, a nitride material, a carbide material, a polymer material, a metal material, and a metal alloy material. By way of non-limiting example, the filler material may include alumina, zirconia, titania, silica (e.g., fumed silica), zinc oxide, silicon nitride, aluminum nitride, tungsten carbide, silicon carbide, carbon black, a solid polymer, aluminum, a nickel titanium alloy, or combinations thereof. Filler material suitable for inclusion in the temporary adhesive of the present disclosure may be obtained commercially, such as PARTICULAR® from Particular GmbH of Hannover, Germany.

The filler material may be substantially homogeneously distributed in the temporary adhesive by mixing the filler material into a solution of the thermoplastic polymer and solvent prior to applying the temporary adhesive to one or both of the surfaces to be bonded together. In some embodiments, at least some of the particles of the filler material may congregate together within the temporary adhesive to form clusters of particles.

The amount (i.e., from about 0.2% by weight to about 5% by weight of the temporary adhesive prior to removing solvent) and particle size (e.g., from about 3 nm to about 100 nm in diameter) of the filler material may be selected to provide mechanical stability to the temporary adhesive at relatively low stress rates, as will be explained in more detail below with reference to FIG. 3, while reducing or avoiding a risk of damage to features of the thinned semiconductor device wafer. For example, if too great a volume of the filler material is used and/or if larger particle sizes are included in the temporary adhesive, then the filler material may damage features on a bonding surface of the thinned wafer. Thus, the amount and particle size ranges of the filler material of the present disclosure may be selected to avoid such damage, while still altering the properties of the temporary adhesive as desired, as explained below. The particle size of the filler material may also be selected to avoid a significant increase in viscosity at relatively higher shear rates, such as at the shear rates induced during debonding.

One or more additives may, optionally, be included in the temporary adhesive of the present disclosure. For example, a surfactant, such as a fluorinated organic hydrocarbon compound, may be included to improve wetting of the surfaces to be bonded with the temporary adhesive. A surfactant may also improve wetting of the filler material in the thermoplastic polymer and solvent mixture. Other optional additives may be used for control of color (e.g., a pigment), odor, adhesion strength, tackiness, foaming (e.g., an anti-foaming agent), etc.

Although embodiments of the temporary adhesive are described herein as initially including a thermoplastic polymer, a solvent, and a filler, the present disclosure is not so limited. For example, in other embodiments, the temporary adhesive may initially include a pre-polymerized thermoplastic material (e.g., a polymerizable thermoplastic material) and a filler material. In such a case, the temporary adhesive may include from about 94% by weight to about 99.8% by weight of the pre-polymerized thermoplastic material, from about 0.2% by weight to about 5% by weight of the filler material, and, optionally, less than 1% of one or more additives. The pre-polymerized thermoplastic material may include one or more of monomers, oligomers, and prepolymers of the thermoplastic material. The pre-polymerized thermoplastic material may also include a polymerization catalyst to facilitate polymerization thereof. The temporary adhesive including the pre-polymerized thermoplastic material may be sufficiently fluid to be applied to a surface (e.g., a bonding surface) without a solvent. After application, the pre-polymerized thermoplastic material may be polymerized (e.g., cured, such as heated, subjected to ultraviolet radiation) to form the thermoplastic polymer. The resulting thermoplastic polymer may lack significant molecular cross-linking and may exhibit a shear thinning property, as described in more detail below. The polymerization may occur after application to a surface of one or both of the semiconductor device wafer and the carrier substrate, after application to a surface of a film (e.g., to form an adhesive tape), or after coupling (e.g., bonding) the semiconductor device wafer to the carrier substrate with the pre-polymerized thermoplastic material.

Figure 3:
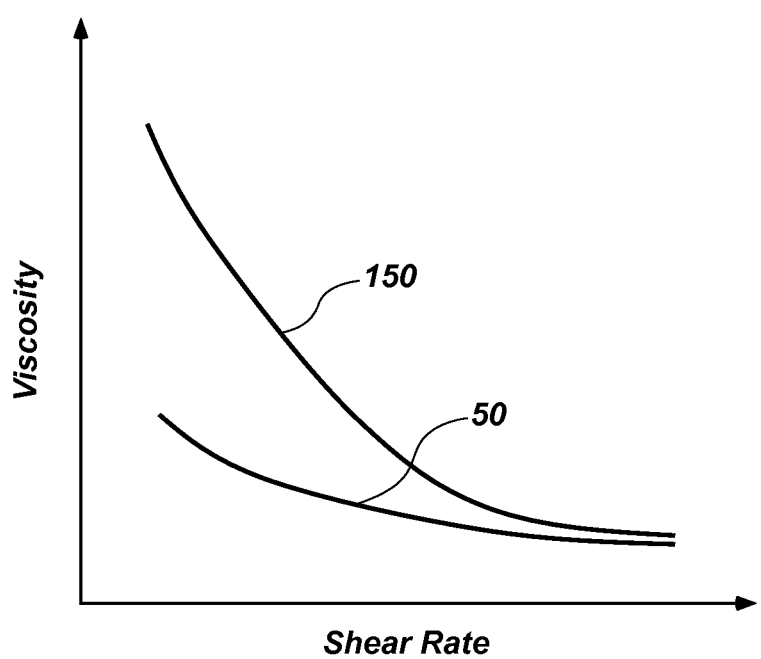
FIG. 3 is a graph illustrating a comparison of a viscosity of a conventional temporary adhesive and a viscosity of a temporary adhesive according to an embodiment of the present disclosure, as a function of shear rate.

FIG. 3 is a graph generally showing a relationship between viscosity and shear rate for a conventional temporary adhesive without any filler material, shown at the first curve 50, and for a temporary adhesive of the present disclosure including a filler material, shown at the second curve 150. A fluid's viscosity is a measure of how thick or resistant to flow the fluid is. Shear rate in a fluid is generally proportional to a speed that a surface bounding the fluid (e.g., the front surface 14 of the thinned wafer 11 of FIG. 2C) moves tangentially to a thickness of the fluid, and is generally inversely proportional to the thickness of the fluid (e.g., the bond line thickness $T_{BL}$ of FIG. 2C). Thus, a shear rate may be increased by increasing a speed at which one surface bounding the fluid is moved relative to another surface bounding the fluid, or by decreasing a distance between the two surfaces bounding the fluid.

As shown in FIG. 3, both the first curve 50 and the second curve 150 illustrate that temporary adhesives for adhering a thinned wafer to a carrier substrate may exhibit a so-called "shear thinning" property. Materials that exhibit shear thinning exhibit decreasing viscosity as a function of increasing shear rate. Both conventional temporary adhesives and temporary adhesives including the filler material may be shear thinning to some extent, to facilitate debonding by application of a shear stress. Thus, as a higher shear rate is applied to the temporary adhesives (for example, by moving the thinned wafer at about 1.5 mm/s relative to the carrier substrate), the temporary adhesives become less viscous (i.e., soften, flow more readily) to facilitate debonding. By way of non-limiting example, a shear rate sufficient for debonding at an elevated temperature may be between about 5 $s^{-1}$ and about 100 $s^{-1}$. However, at relatively lower shear rates, such as at shear rates to which the temporary adhesives are subjected during back side processing of a thinned wafer, the temporary adhesive is relatively more viscous and, therefore, more mechanically stable. By way of non-limiting example, a shear rate that the temporary adhesive may experience during some back side processing operations (e.g., mechanical grinding, CMP) may be less than about 1 $s^{-1}$. In some embodiments, the temporary adhesive may experience a shear rate of substantially zero (0) $s^{-1}$ during the back side processing operations prior to debonding. As noted above, temperature may also affect the viscosity of the temporary adhesive, although the graph of FIG. 3 illustrates the viscosity properties of the temporary adhesives as a function of shear rate at a constant temperature, such as at a temperature experienced by the temporary adhesive during back side processing and induced during debonding.

Comparing the second curve 150 with the first curve 50 of FIG. 3, at relatively low shear rates, the temporary adhesive including the filler material (i.e., a basis for the second curve 150) may be relatively more viscous than a similar temporary adhesive lacking a filler material (i.e., a basis for the first curve 50). However, at higher shear rates, a difference between the viscosity of the temporary adhesive including the filler material and the viscosity of the temporary adhesive lacking a filler material may be less. In some embodiments, the viscosity at higher shear rates may be substantially the same for the temporary adhesive including the filler material and the temporary adhesive lacking the filler material, even though their viscosities at lower shear rates may be substantially different. As noted above, the average particle size of the filler material (e.g., between about 3 nm and about 100 nm) may be selected to avoid a significant increase in viscosity at relatively higher shear rates, while, at relatively lower shear rates, the viscosity of the temporary adhesive with the filler material may be significantly higher than the temporary adhesive without the filler material. Additionally, the difference in viscosity at a low shear rate versus a high shear rate for the temporary adhesive including the filler material may be greater than the corresponding difference in viscosity for the temporary adhesive lacking the filler material. The greater difference in viscosity of the temporary adhesive including the filler material at low shear rates compared to higher shear rates enables a greater mechanical stability at the low shear rates experienced during back side processing, while still enabling debonding by application of a shear rate comparable to shear rates used for temporary adhesives without filler material.

In some embodiments, the filler material may be selected to be more thermally conductive than the selected material of the thermoplastic polymer of the temporary adhesive, as such polymers exhibit a very low thermal conductivity and essentially provide a thermal barrier between a wafer under processing and the carrier substrate bearing the wafer. Thermally conductive filler material may enable heat generated or applied during back side processing of a wafer to be transferred from the semiconductor device wafer through the temporary adhesive more efficiently than if a temporary adhesive lacking a filler material is used. This enhanced heat transfer may reduce thermal stress in the semiconductor device wafer, the temporary adhesive, and the carrier substrate, placing a lower demand on the overall available thermal budget for the wafer. Additionally, process time may be reduced by effectively speeding up cooling or heating times. In addition, a risk of damaging semiconductor device elements in the semiconductor device wafer due to overheating may be reduced.

Accordingly, a temporary adhesive is disclosed including a thermoplastic polymer in an amount of from about 30% by weight to about 80% by weight of the temporary adhesive, a solvent in an amount of from about 20% by weight to about 70% by weight of the temporary adhesive, and a filler material in an amount of from about 0.2% by weight to about 5% by weight of the temporary adhesive. In some embodiments, the filler material includes particles having an average particle diameter of between about 3 nm and about 100 nm. In some embodiments, the temporary adhesive also includes a surfactant in an amount less than about 1% by weight of the temporary adhesive.

Figure 4:
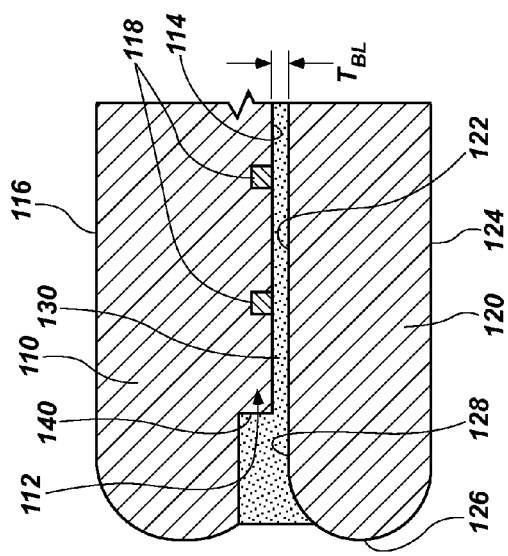
FIGS. 4 through 6 illustrate a method of processing a semiconductor device wafer according to an embodiment of the present disclosure.
Figure 6:
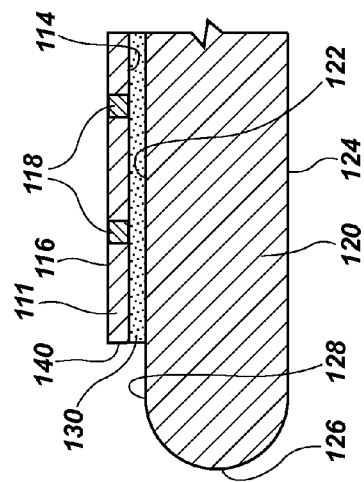
Figure 5:
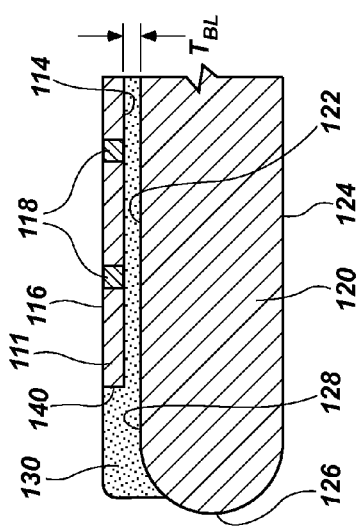

FIGS. 4 through 6 illustrate a method of processing a semiconductor device wafer 110 according to an embodiment of the present disclosure. By way of non-limiting example, the semiconductor device wafer 110 may be used to form a plurality of memory dice, light-emitting diodes (LEDs), imager dice, logic dice, microprocessor dice, or micro-electromechanical system (MEMS) devices. The semiconductor device wafer 110 includes a device region 112 proximate a front surface 114 thereof, which may include features of the semiconductor devices formed on, and to be eventually singulated from, the semiconductor device wafer 110. In some embodiments, the device region 112 may include through-silicon vias (TSVs) 118, transistors, capacitors, conductive traces, dielectric materials, etc., as well as discrete conductive elements such as pillars, bumps, columns, and studs protruding from the front surface 114. The TSVs 118 may extend from the front surface 114 into and at least partially, if not completely, through the device region 112. Discrete conductive elements may, in one embodiment, comprise copper/nickel/tin-silver solder pillars, with the copper providing a base for the pillars, and nickel providing a barrier layer between the copper and the tin-silver solder. Of course, other materials and configurations for discrete conductive elements are known in the art. A portion of the semiconductor device wafer 110 between the device region 112 and a back surface 116 thereof may be formed of a bulk semiconductor material (e.g., silicon).

The semiconductor device wafer 110 may be bonded to a carrier substrate 120 with a temporary adhesive 130 that includes the filler material, as described above. The carrier substrate 120 may be a relatively rigid substrate, such as another semiconductor wafer, a glass wafer, a metal plate, etc., and may have a top surface 122 and a bottom surface 124. It is noted that the terms "top" and "bottom" are used herein with reference to the drawings of the present disclosure and do not necessarily connote any specific orientation. The top surface 122 may include an edge region 128 proximate a peripheral edge 126 of the carrier substrate 120 that is not directly covered by (i.e., does not directly underlie) the device region 112 of the semiconductor device wafer 110.

As explained above, the temporary adhesive 130 of the present disclosure may initially include a thermoplastic polymer material, a solvent, a filler material, and, optionally, one or more additives. Alternatively, as further explained above, the temporary adhesive 130 may initially include a pre-polymerized thermoplastic material and a filler material without a solvent. As applied, the temporary adhesive 130 may be in the form of a liquid or semi-liquid solution, an emulsion, a gel, a paste, a film, or a tape, for example. If the temporary adhesive 130 is in the form of a film or a tape, the solvent in the temporary adhesive 130, if initially present, may be removed from the temporary adhesive 130 prior to applying the temporary adhesive 130 to one or more of the semiconductor device wafer 110 and the carrier substrate 120. Additionally, in embodiments in which the temporary adhesive 130 initially includes a pre-polymerized thermoplastic material and lacks a solvent and in which the temporary adhesive 130 is in the form of a film or tape, the pre-polymerized thermoplastic material may be polymerized on a film or tape backing prior to applying the temporary adhesive 130 to one or more of the semiconductor device wafer 110 and the carrier substrate 120.

To bond the semiconductor device wafer 110 to the carrier substrate 120, the temporary adhesive 130 may be applied to one or both of the top surface 122 of the carrier substrate 120 and the front surface 114 of the semiconductor device wafer 110 in any conventional manner depending on the form of the temporary adhesive 130, as will be understood by one of ordinary skill in the art. For example, if the temporary adhesive 130 is initially liquid or semi-liquid, then the temporary adhesive 130 may be applied using a spin-coating process. By way of another example, if the temporary adhesive 130 is in tape form, then a tape application mechanism may be used to apply the temporary adhesive 130.

After application of the temporary adhesive 130, the temporary adhesive 130 may be subjected to heat for a period of time (e.g., between about 1 minute and about 120 minutes) to at least one of cure (e.g., polymerize) the temporary adhesive 130 and remove at least a portion of the solvent therefrom (if the solvent is present), such that the temporary adhesive 130 becomes more mechanically stable. For example, the temporary adhesive 130 may be exposed to a temperature of below about 350° C., such as between about 150° C. and about 200° C., to cure the temporary adhesive 130 or to remove the solvent from the temporary adhesive 130. The particular time and temperature may be a function of the particular composition of the temporary adhesive 130, such as the selected thermoplastic polymer and solvent of the temporary adhesive 130. As noted above, in embodiments in which the temporary adhesive 130 is in a film or tape form, curing and/or solvent removal may take place while the temporary adhesive 130 is on a film or tape backing, prior to applying the temporary adhesive 130 to the surface(s) to be bonded.

After the temporary adhesive 130 is cured and/or the solvent is removed from the temporary adhesive 130, and after the temporary adhesive 130 is applied to one or both of the semiconductor device wafer 110 and the carrier substrate 120, the semiconductor device wafer 110 may be positioned proximate to and pressed against the carrier substrate 120 for bonding. As used herein, the phrase "pressed against" does not imply direct physical contact between the semiconductor device wafer 110 and the carrier substrate 120. Rather, the temporary adhesive 130 may be disposed between the semiconductor device wafer 110 and the carrier substrate 120 to, among other functions, prevent direct physical contact therebetween. In some embodiments, a bonding head may be used to both apply pressure to the semiconductor device wafer 110 and to expose the temporary adhesive 130 to heat, as is known in the art. Furthermore, the bonding may take place in a low pressure (e.g., vacuum) environment to substantially remove voids or pockets of gas that may be present at a bonding interface between the semiconductor device wafer 110 and the carrier substrate 120. Thus, after bonding, the bonding interface may be substantially fully filled with the temporary adhesive 130 and substantially free of voids or pockets of gas. Since the front surface 114 of the semiconductor device wafer 110 and the top surface 122 of the carrier substrate 120 are bonded together by the temporary adhesive 130, these surfaces are also referred to herein as bonding surfaces.

An average bond line thickness $T_{BL}$ between the semiconductor device wafer 110 and the carrier substrate 120 after bonding may be a function of variables of the bonding process, such as the pressure applied to press the semiconductor device wafer 110 against the carrier substrate 120, the composition of the temporary adhesive 130, the bonding temperature, the period of time at which the elevated temperature is maintained, and the volume of the temporary adhesive 130. Furthermore, the average bond line thickness $T_{BL}$ may be selected based on a topography irregularity on the front surface 114 of the semiconductor device wafer 110, as explained above. As used herein, the term "topography irregularity" means and includes a difference in height between a major plane of a semiconductor wafer front surface 114 exhibiting a nonplanar topography and the feature or features projecting a greatest distance therefrom. For example, a relatively greater topography irregularity of features on the front surface 114 may generally lead to a selection of a relatively higher average bond line thickness $T_{BL}$ to avoid damage to such features. The average bond line thickness $T_{BL}$ may be substantially uniform in thickness across the bonding interface to improve control and reliability of subsequent processes. By way of example and not limitation, the average bond line thickness $T_{BL}$ may be between about 18 μm and about 95 μm. For example, the temporary adhesive 130 having an average bond line thickness $T_{BL}$ of about 18 μm may be sufficient for thinned wafers 111 having a topography irregularity of about 5 μm (i.e., having features that extend to about 5 μm from a surrounding portion of the front surface 114). However, a higher topography irregularity may require a higher bond line thickness $T_{BL}$ to avoid damaging features on the front surface 114. For example, for thinned wafers 111 having a topography irregularity of about 33 μM, a temporary adhesive 130 having an average bond line thickness $T_{BL}$ of about 54 μm may be sufficient. Similarly, for thinned wafers 111 having a topography irregularity of about 70 μm, a temporary adhesive 130 having an average bond line thickness $T_{BL}$ of about 95 μm may be sufficient.

After bonding, a portion of the semiconductor device wafer 110 may be removed (e.g., thinned) by, for example, a coarse mechanical grinding operation, a fine mechanical grinding operation, and/or a chemical-mechanical polishing (CMP) operation to remove bulk semiconductor material from proximate the back surface 116 of the semiconductor device wafer 110. The thinning operation may form a thinned semiconductor device wafer 111 (referred to below as a "thinned wafer 111" for simplicity), as shown in FIG. 5. Such a thinned wafer may have a thickness of, for example, about 50 μm. The semiconductor device wafer 110 may be thinned and/or etched (e.g., dry etched or wet etched) until portions of the TSVs 118 opposite the front surface 114 are exposed in what is termed "via reveal." Thus, after thinning, the TSVs 118 may extend from the front surface 114 through the thinned wafer 111 to the back surface 116 of the thinned wafer 111.

After thinning, the thinned wafer 111 may be subjected to additional back side processing, such as selective material removal (e.g., photolithography, plasma dry etching, chemical wet etching, etc.), cleaning, and material formation (e.g., formation of a conductive material; patterning of a conductive material to form bond pads, traces for a redistribution layer (RDL), or both; formation of a dielectric material; etc.) operations. During such back side processing, the temporary adhesive 130 may remain over the edge region 128 of the top surface 122 of the carrier substrate 120 and radially outside of a peripheral edge 140 of the thinned wafer 111, as shown in FIG. 5. In other words, the necessity of a cleaning or other removal process of the temporary adhesive 130 from over the edge region 128 in the manner described above with reference to FIG. 2A may be avoided. Furthermore, the temporary adhesive 130 may not be subjected to an elevated temperature after such cleaning in the manner described above with reference to FIG. 2B, since no additional solvent is introduced into the temporary adhesive 130 due to the elimination of the edge cleaning operation. Since these cleaning and removal acts do not need to be conducted, the method of the present disclosure may have a reduced cost compared to conventional techniques that require these acts.

A risk of contamination of the back surface 116 of the thinned wafer 111 or of the bottom surface 124 of the carrier substrate 120 may be reduced or eliminated due to the presence of the filler material within the temporary adhesive 130, even without the edge cleaning. As explained above with reference to FIG. 3, the filler material may enable the temporary adhesive 130 to be more viscous and more mechanically stable at the conditions (e.g., temperatures and shear rates) experienced during the back side processing. Accordingly, the temporary adhesive 130 may not soften during back side processing sufficiently to flow onto the back surface 116 of the thinned wafer 111 or the bottom surface 124 of the carrier substrate 120. Even if the average bond line thickness $T_{BL}$ is relatively high, such as due to irregular topography on the front surface 114 of the thinned wafer 111, the filler material may reduce or eliminate unwanted flow of the temporary adhesive 130. Accordingly, the problems discussed above with reference to FIGS. 1A through 1C may be reduced or avoided, while reducing or avoiding the additional processes and problems associated with the modified method described above with reference to FIGS. 2A through 2C.

Additionally, the thinned wafer 111 may be debonded from the carrier substrate 120 using a conventional method of applying a relatively high shear rate to the temporary adhesive 130 at an elevated temperature (e.g., about 200° C.). In some embodiments, shear force may be applied by rotational movement, by linear movement, or by both rotational and linear movement of the thinned wafer 111 relative to the carrier substrate 120. For example, shear force may be applied in a direction parallel to the bonding interface to the thinned wafer 111 by rotating a debonding chuck while applying a rotational force to the carrier substrate 120 in an opposite direction, or while holding the carrier substrate 120 in a fixed position. The debonding chuck may hold the thinned wafer 111 by a vacuum force. Thus, although the temporary adhesive 130 may not flow at the conditions of the back side processing, the temporary adhesive 130 may flow during the application of a sufficient shear force and/or heat since the viscosity decreases at increased shear rates and at increased temperatures. In some embodiments, the thinned wafer 111 may be moved relative to the carrier substrate 120 at a speed of about 1.5 mm/s to induce a sufficient shear rate for debonding. In some embodiments, the elevated debonding temperature may be selected specifically at a temperature, for example, 200° C., to be below a melting point of materials, such as a tin-silver solder material capping pillars previously formed on the thinned wafer 111. Other thermal considerations impacting flow behavior of temporary adhesive 130 include curing of a photosensitive material (e.g., photoresist) on the back side of thinned semiconductor wafer 111, conducted, for example, at 180° C. for three hours. The temporary adhesive 130 may also be exposed to elevated temperatures during other back side processes, such as CVD and PVD, for example. As explained above with reference to FIG. 3, at high shear rates, the viscosity of the temporary adhesive 130 including the filler material may drop to a value that is near, or even substantially equal to, a viscosity of a similar temporary adhesive lacking any filler material. Thus, debonding of the thinned wafer 111 from the carrier substrate 120 that is bonded with the temporary adhesive 130 including the filler material may be performed in substantially the same manner (e.g., at substantially the same conditions and using the same tools) as with the temporary adhesive 30 lacking any filler material, as described above.

Referring to FIG. 6, optionally, after the back side processing and prior to debonding, the temporary adhesive 130 may be cleaned or otherwise removed from over the edge region 128 of the carrier substrate 120, such as by dissolving the temporary adhesive 130 with an appropriate solvent. The cleaning of the edge region 128 may reduce or eliminate a risk of contaminating a debonding chuck used to heat and apply a force in shear to the thinned wafer 111 (i.e., parallel to a bonding interface) to induce the conditions in the temporary adhesive 130 sufficient for debonding. However, no additional heating processes would be required to remove any solvent from the temporary adhesive 130 proximate the peripheral edge 140 of the thinned wafer 111, since a presence of the solvent in the temporary adhesive 130 poses little or no risk during debonding, and other back side processes that would otherwise be affected by the solvent have been completed. Thus, the debonding may be performed without removing solvent introduced into the temporary adhesive 130 during the optional cleaning of the edge region 128.

After debonding, any temporary adhesive 130 remaining on the thinned wafer 111 and/or on the carrier substrate 120 may be conventionally removed, such as by using an appropriate solvent to dissolve the remaining temporary adhesive 130. One of ordinary skill in the art will be capable of selecting the appropriate solvent for the cleaning, given the composition of the temporary adhesive 130.

Accordingly, in some embodiments of the present disclosure, methods of processing a semiconductor device wafer include applying a temporary adhesive on one or both of a semiconductor device wafer and a carrier substrate. The temporary adhesive includes a thermoplastic polymer and a filler material in an amount of from about 0.2% by weight to about 5% by weight of the temporary adhesive. The semiconductor device wafer is bonded to a surface of the carrier substrate with the temporary adhesive. Material is removed from the semiconductor device wafer to thin the semiconductor device wafer. While the temporary adhesive remains on the surface of the carrier substrate proximate a peripheral edge thereof and radially outside of a peripheral edge of the thinned semiconductor device wafer, the thinned semiconductor device wafer is subjected to at least one of selective material removal, cleaning, and material formation operations. In some embodiments, the filler material is substantially homogeneously distributed in a solution of the thermoplastic polymer and solvent.

Additionally, in some embodiments of the present disclosure, methods of forming a thinned semiconductor device wafer include bonding a front surface of a semiconductor device wafer to a carrier substrate with a temporary adhesive that includes a thermoplastic polymer and a filler material in an amount of from about 0.2% by weight to about 5% by weight of the temporary adhesive. Material from a back side of the semiconductor device wafer is removed while the semiconductor device wafer is bonded to the carrier substrate. One or more back side processing operations are performed on the semiconductor device wafer without removing the temporary adhesive from the carrier substrate proximate a peripheral edge of the carrier substrate. A force may be applied in shear between the semiconductor device wafer and the carrier substrate to debond the semiconductor device wafer from the carrier substrate. In some embodiments, temporary adhesive is removed from the carrier substrate proximate the peripheral edge of the carrier substrate prior to applying the force in shear. In some embodiments, an average bond line thickness of between about 18 μm and about 95 μm is maintained between the semiconductor device wafer and the carrier substrate.

The temporary adhesive according to embodiments of the present disclosure exhibits high thermal, chemical and mechanical stability, and provides good thickness uniformity across a wafer during downstream back side processing. In addition, the temporary bonding adhesive is readily debonded and cleaned without inducing defects to a wafer front surface 114 and conductive pillars or other protruding discrete conductive elements.

Although the compositions and methods of the present disclosure have been described with reference to temporarily bonding a semiconductor device wafer to a carrier substrate for thinning and other processing of the semiconductor device wafer, the present disclosure is not so limited. For example, a temporary adhesive including a filler material, as described above, may be used to bond any two substrates or structures together. In some embodiments, the temporary adhesive including the filler material may be used in a so-called "wafer-level process (WLP)," a so-called "chip-scale process (CSP)," a so-called "wafer-level molding" process, etc. For example, individual or stacked semiconductor dice may be bonded to a base semiconductor wafer using such a temporary adhesive prior to encapsulating the semiconductor dice in a molding material.

The embodiments of the disclosure described above and illustrated in the accompanying drawing figures do not limit the scope of the invention, since these embodiments are merely examples of embodiments of the disclosure, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. An adhesive comprising:
  a thermoplastic polymer comprising from about 30% by weight to about 80% by weight of the adhesive;
  a solvent comprising from about 20% by weight to about 70% by weight of the adhesive, the solvent comprising at least one of n-decane, isododecane, isododecene, d-limonene, and mesitylene; and
  a filler material comprising from about 0.2% by weight to about 5% by weight of the adhesive.

2. The adhesive of claim 1, wherein particles of the filler material comprise particles having an average particle diameter of between about 3 nm and about 100 nm.

3. The adhesive of claim 1, wherein the filler material comprises at least one of alumina, zirconia, titania, silica, zinc oxide, silicon nitride, aluminum nitride, tungsten carbide, silicon carbide, carbon black, a solid polymer, aluminum, and a nickel titanium alloy.

4. The adhesive of claim 1, wherein the filler material comprises fumed silica.

5. The adhesive of claim 1, wherein the adhesive exhibits decreasing viscosity as a function of increasing shear rate.

6. The adhesive of claim 1, wherein the thermoplastic polymer comprises at least one of a polyolefin resin, a thermoplastic polyurethane, a thermoplastic copolyester, a thermoplastic organopolysiloxane, a thermoplastic polyimide, a thermoplastic polyamide, and a styrenic block copolymer.

7. The adhesive of claim 1, further comprising less than about 1% by weight of a surfactant.

8. The adhesive of claim 1, wherein the filler material comprises a thermally conductive material that is more thermally conductive than the thermoplastic polymer.

9. A method of processing a semiconductor device wafer, the method comprising:
  applying an adhesive on one or both of a semiconductor device wafer and a carrier substrate, the adhesive comprising a thermoplastic polymer in an amount of from about 30% by weight to about 80% by weight of the adhesive, a solvent comprising at least one of n-decane, isododecane, isododecene, d-limonene, and mesitylene in an amount of from about 20% by weight to about 70% by weight of the adhesive, and a filler material in an amount of from about 0.2% by weight to about 5% by weight of the adhesive;
  bonding the semiconductor device wafer to a surface of the carrier substrate with the adhesive;
  removing material from the semiconductor device wafer to thin the semiconductor device wafer; and
  while the adhesive remains on the surface of the carrier substrate proximate a peripheral edge thereof and radially outside of a peripheral edge of the thinned semiconductor device wafer, subjecting the thinned semiconductor device wafer to at least one of a selective material removal, cleaning, and material formation operation.

10. The method of claim 9, further comprising heating the adhesive to substantially remove the solvent from the adhesive prior to bonding the semiconductor device wafer to a surface of the carrier substrate.

11. The method of claim 9, further comprising substantially homogeneously distributing the filler material in a solution of the thermoplastic polymer and the solvent prior to applying the adhesive on the one or both of the semiconductor device wafer and the carrier substrate.

12. The method of claim 11, wherein substantially homogeneously distributing the filler material in a solution of the thermoplastic polymer and the solvent comprises mixing the filler material having an average particle diameter of between about 10 nm and about 15 nm into the solution of the thermoplastic polymer and the solvent.

13. The method of claim 9, wherein applying an adhesive on one or both of a semiconductor device wafer and a carrier substrate comprises one of spin-coating a liquid or semi-liquid adhesive thereon and applying an adhesive in tape form thereon.

14. The method of claim 9, wherein the filler material of the adhesive comprises particles of at least one of alumina, zirconia, titania, silica, zinc oxide, silicon nitride, aluminum nitride, tungsten carbide, silicon carbide, carbon black, and a solid polymer.

15. A method of forming a thinned semiconductor device wafer, the method comprising:
  bonding a front surface of a semiconductor device wafer to a carrier substrate with an adhesive comprising a thermoplastic polymer in an amount of from about 30% by weight to about 80% by weight of the adhesive, a solvent comprising at least one of n-decane, isododecane, isododecene, d-limonene, and mesitylene in an amount of from about 20% by weight to about 70% by weight of the adhesive, and a filler material, the filler material comprising from about 0.2% by weight to about 5% by weight of the adhesive;
  removing material from a back side of the semiconductor device wafer while the semiconductor device wafer is bonded to the carrier substrate;
  without removing the adhesive from the carrier substrate proximate a peripheral edge of the carrier substrate, performing one or more back side processing operations on the semiconductor device wafer; and
  applying a force between the semiconductor device wafer and the carrier substrate to debond the semiconductor device wafer from the carrier substrate.

16. The method of claim 15, wherein performing one or more back side processing operations on the semiconductor device wafer comprises one or more of removing material from the back side of the semiconductor device wafer opposite the front surface, cleaning the back side of the semiconductor device wafer, and forming material on the back side of the semiconductor device wafer.

17. The method of claim 15, further comprising removing the adhesive from the carrier substrate proximate the peripheral edge of the carrier substrate prior to applying the force.

18. The method of claim 15, further comprising heating the adhesive to a temperature below about 350° C. while applying the force between the semiconductor device wafer and the carrier substrate to debond the semiconductor device wafer from the carrier substrate.

19. The method of claim 15, further comprising:
  applying the thermoplastic polymer, the filler material, and the solvent to one or both of the front surface of the semiconductor device wafer and the carrier substrate; and
  removing the solvent prior to bonding the semiconductor device wafer to the carrier substrate to form the adhesive.

20. The method of claim 15, further comprising:
  applying a pre-polymerized thermoplastic material and the filler material to one or both of the front surface of the semiconductor device wafer and the carrier substrate; and
  curing the pre-polymerized thermoplastic material to polymerize the pre-polymerized thermoplastic material and to form the thermoplastic polymer of the adhesive.

21. The method of claim 15, further comprising:
  applying the adhesive to a film or tape backing; and
  heating the adhesive on the film or tape backing to at least one of cure the adhesive and remove the solvent from the adhesive.

22. The method of claim 15, wherein removing material from a back side of the semiconductor device wafer while the semiconductor device wafer is bonded to the carrier substrate comprises exposing portions of through-silicon vias opposite the front surface of the semiconductor device wafer.

23. The method of claim 15, wherein bonding a front surface of a semiconductor device wafer to a carrier substrate with an adhesive comprises maintaining an average bond line thickness of between about 18 μm and about 95 μm between the semiconductor device wafer and the carrier substrate.

24. The method of claim 15, wherein bonding a front surface of a semiconductor device wafer to a carrier substrate with an adhesive comprises using an adhesive comprising a thermoplastic polymer exhibiting a shear thinning property.

25. The method of claim 15, wherein applying a force between the semiconductor device wafer and the carrier substrate comprises applying a force in shear between the semiconductor device wafer and the carrier substrate.

26. The adhesive of claim 7, wherein the surfactant comprises a fluorinated organic hydrocarbon.

27. An adhesive comprising:
  a thermoplastic polymer comprising from about 30% by weight to about 80% by weight of a total weight of the adhesive;
  a solvent comprising from about 20% by weight to about 70% by weight of the total weight of the adhesive; and
  a filler material comprising from about 0.2% by weight to about 5% by weight of the total weight of the adhesive, the filler material consisting of silica.

\* \* \* \* \*